US010432178B2

(12) United States Patent
Tornila Oliver

(10) Patent No.: US 10,432,178 B2
(45) Date of Patent: Oct. 1, 2019

(54) HYSTERESIS COMPARATOR

(71) Applicant: NXP B.V., Eindhoven (NL)

(72) Inventor: Jaume Tornila Oliver, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/122,574

(22) Filed: Sep. 5, 2018

(65) Prior Publication Data

US 2019/0158072 A1    May 23, 2019

(30) Foreign Application Priority Data

Nov. 20, 2017  (EP) .................................... 17202557

(51) Int. Cl.

| H03K 3/00 | (2006.01) |
|---|---|
| *H03K 3/3565* | (2006.01) |
| *H03K 3/037* | (2006.01) |
| *H03K 5/24* | (2006.01) |
| *G05F 3/26* | (2006.01) |
| *H03K 3/011* | (2006.01) |
| H03K 3/013 | (2006.01) |
| H03K 3/0233 | (2006.01) |

(52) U.S. Cl.
CPC ........... *H03K 3/3565* (2013.01); *G05F 3/262* (2013.01); *H03K 3/011* (2013.01); *H03K 3/0377* (2013.01); *H03K 5/24* (2013.01); H03K 3/013 (2013.01); H03K 3/02337 (2013.01); H03K 5/2481 (2013.01)

(58) Field of Classification Search
CPC ...... H03K 5/2481; H03K 5/249; H03K 3/011; H03K 3/013; H03K 3/2893; H03K 3/02337; H03K 3/0377; H03K 3/3565; H03F 3/45183; G01R 19/0038; G05F 3/262

See application file for complete search history.

(56) References Cited

U.S. PATENT DOCUMENTS

| 5,369,319 A | 11/1994 | Good et al. |
|---|---|---|
| 5,528,185 A | 6/1996 | Lewicki et al. |
| 5,608,344 A | 3/1997 | Marlow |

(Continued)

FOREIGN PATENT DOCUMENTS

WO    WO 2017/046073    *  3/2017

OTHER PUBLICATIONS

Qian et al., "A Low-power Comparator with Programmable Hysteresis Level for Blood Pressure Peak Detection," TENCON 2009—2009 IEEE Region 10 Conference, 4 pages.

*Primary Examiner* — Long Nguyen

(57) ABSTRACT

The present application relates to a hysteresis comparator, which comprises a hysteresis comparator circuit and a hysteresis generating circuit. The hysteresis comparator circuit two comparator legs each with a differential transistor and a load transistor. The differential transistors receive a comparator biasing current, which is variably divided based on the relative levels of the voltage signals applied to control terminals of the differential transistors. An output stage is provided for developing an output voltage signal based on currents flowing through the load transistors. The hysteresis generating circuit is arranged for selectively injecting a hysteresis current in or selectively drawing a hysteresis current from either one of the two comparator legs depending on the level of the output voltage signal.

16 Claims, 7 Drawing Sheets

(56) References Cited

U.S. PATENT DOCUMENTS

| | | | |
|---|---|---|---|
| 8,975,926 B2 * | 3/2015 | Zhang | H03K 3/3565 327/63 |
| 9,654,088 B2 | 5/2017 | Chen et al. | |
| 2007/0040587 A1 | 2/2007 | Chatal | |

* cited by examiner

HYSTERESIS COMPARATOR

CROSS-REFERENCE TO RELATED APPLICATIONS

This application claims priority under 35 U.S.C. § 119 to European patent application no. EP 17202557.9, filed Nov. 20, 2017, the contents of which are incorporated by reference herein.

FIELD OF THE INVENTION

The present disclosure relates generally to a metal oxide semiconductor (MOS) hysteresis comparator, and more particularly, to a MOS hysteresis comparator having a hysteresis characteristic, which is substantially unaffected by variations in temperature and manufacturing process.

BACKGROUND

Comparators are commonly employed for threshold detection applications, where the output of the comparator changes state depending on whether a variable input voltage is above or below a reference voltage. For example, a comparator can be used as a zero-crossing detector to provide a logic level digital output signal based on an AC input voltage developed by a magnetic variable reluctance speed sensor.

In applications where electrical noise is superimposed on an input signal, the comparator may change states based on the noise content of the input signal when the input voltage approaches the switch point of the comparator. To desensitize the comparator to such noise, the comparator circuit is designed with a hysteresis characteristic, which effectively increases or decreases the reference voltage, depending on the output state of the comparator.

In the state of the art, various different implementations of hysteresis comparators are known. A conventional technique makes use of an operational amplifier and resistive feedback to provide the hysteresis characteristic. U.S. Pat. No. 5,369,319 A for instance describes a MOS hysteresis comparator, which is defined by a current source transistor Qs feeding a differential transistor pair Q5, Q6, each of which is connected in series with a respective load transistor Q1, Q4. Each series connection of a differential transistor Q5 or Q6 and a load transistor Q1 or Q4 forms a respective first or second comparator leg. Hysteresis transistors Q2 and Q3 are cross-coupled between the first and second comparator legs and efficiently shift the switching point of the comparator to achieve a hysteresis characteristic. U.S. Pat. No. 5,369,319 further describes a source transistor bias circuit to compensate for process, voltage and temperature (PVT) variations.

Although U.S. Pat. No. 5,369,319 suggests a source transistor bias circuit, which enables the compensation of PVT variations of the hysteresis voltage, the proposed source transistor bias circuit has several drawbacks:

increased area and power requirement because of the need of an error amplifier;

risk of instability because of the need of a feedback loop; and a start-up signal and circuitry because of an initial undefined state after putting proposed current source transistor bias circuit into operation.

Hence, there is still a need for a metal oxide semiconductor (MOS) hysteresis comparator circuit, and more particularly, a MOS hysteresis comparator circuit having a hysteresis characteristic, which is substantially unaffected by variations in temperature and manufacturing process.

SUMMARY

The present invention provides a hysteresis comparator as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION

Figure 1A:
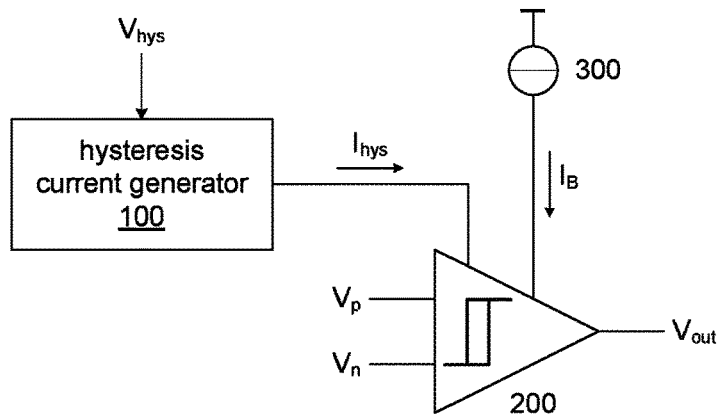
FIGS. 1A and 1B schematically illustrate discrete schematic circuit diagrams of hysteresis comparators according to embodiments of the present application.

Embodiments of the present disclosure will be described below in detail with reference to drawings. Note that the same reference numerals are used to represent identical or equivalent elements in figures, and the description thereof will not be repeated. The embodiments set forth below represent the necessary information to enable those skilled in the art to practice the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1B:
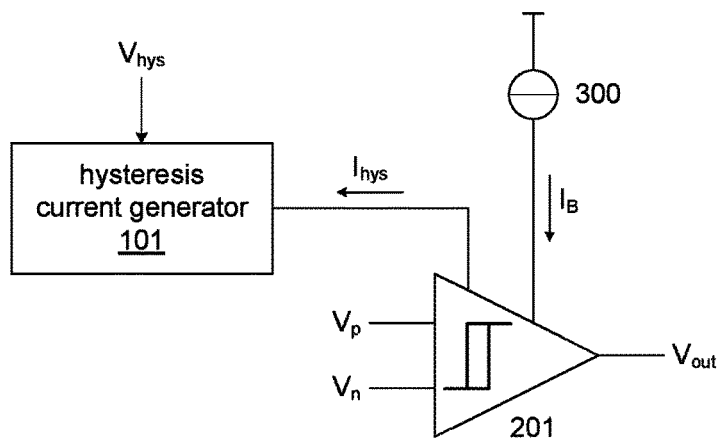
Figure 2:
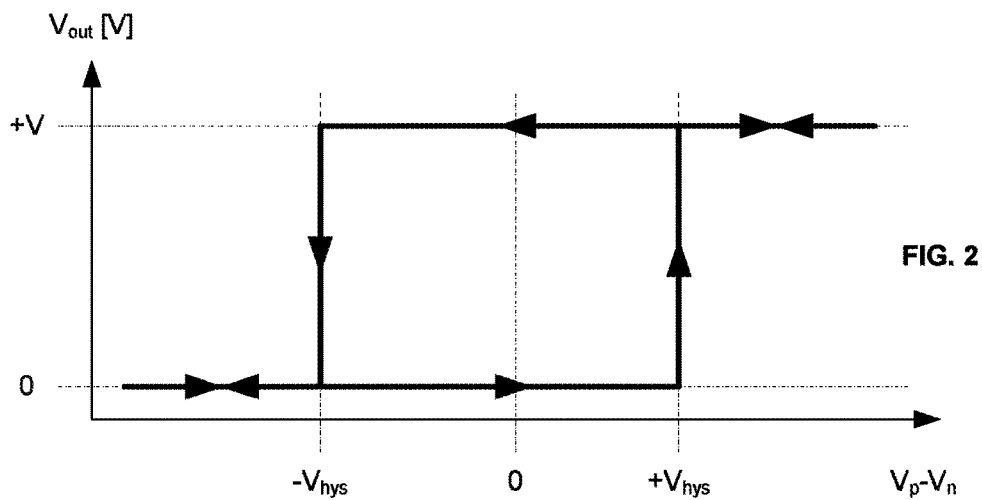
FIG. 2 schematically depicts an idealized transfer function illustrating a hysteresis comparator output voltage signal $V_{out}$ as a function of a difference of hysteresis comparator input voltage signals.

Referring now to FIGS. 1A and 1B, discrete schematic circuit diagrams of hysteresis comparators according to embodiments of the present application are illustrated. The embodied hysteresis comparator of FIG. 1A comprise a hysteresis comparator circuit 200, a hysteresis generating circuit 100 and a current source circuitry 300. The embodied hysteresis comparator of FIG. 1B comprise a hysteresis comparator circuit 201, a hysteresis generating circuit 101 and a current source circuitry 300. The hysteresis comparator circuit 200 accepts two voltage signals $V_p$ and $V_n$ at respective inputs and outputs an output signal $V_{out}$ at an output. The hysteresis comparator circuit 200 is arranged to show hysteresis characteristic as schematically illustrated in a graph of FIG. 2 depicting an idealized hysteresis characteristic of the hysteresis comparators of FIGS. 1A and 1B. FIG. 2 depicts an idealized transfer function illustrating the output voltage signal $V_{out}$ as a function of the difference of the input voltage signals $V_p$ and $V_n$. As long as the input voltage difference $V_p-V_n$ increases from a relative low value (e.g. $V_p-V_n<-V_{hys}$) the output signal $V_{out}$ remains at a high state (e.g. +V) until the input voltage difference $V_p-V_n$ exceeds the upper hysteresis voltage $+V_{hys}$, in response to which the output signal $V_{out}$ transitions to a low state (e.g. 0 V). When the input voltage difference $V_p-V_n$ is subsequently reduced, the output signal $V_{out}$ remains at the low state (e.g. 0 V) until the input voltage difference $V_p-V_n$ falls below the lower hysteresis voltage $-V_{hys}$, in response to which the output signal $V_{out}$ transitions to the high state (e.g. +V).

The hysteresis characteristic of the embodied hysteresis comparators is obtained by injecting a hysteresis current $I_{hys}$ or by drawing a hysteresis current $I_{hys}$. The hysteresis current $I_{hys}$ is a function of the hysteresis voltage $V_{hys}$. The hysteresis current $I_{hys}$, is for instance provided by the hysteresis generating circuit 100, which injects the hysteresis current $I_{hys}$ in the hysteresis comparator circuit 200 or the hysteresis current $I_{hys}$, is for instance drawn by the hysteresis generating circuit 101, which draws the hysteresis current $I_{hys}$ from the hysteresis comparator circuit 201.

Figure 3:
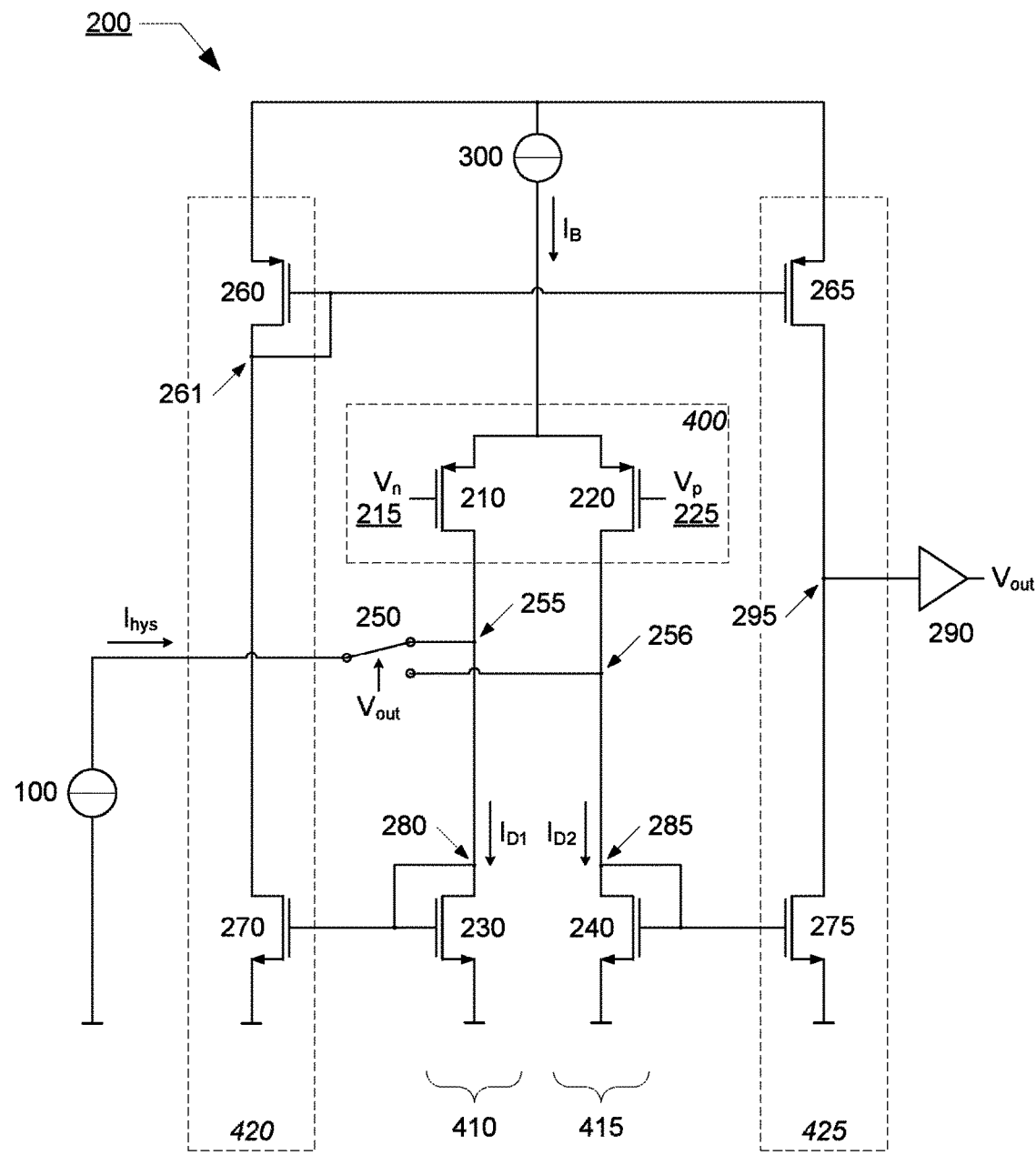
FIG. 3 schematically illustrates a discrete schematic circuit diagram of a MOS hysteresis comparator circuit according to an embodiment of the present application.

A discrete schematic circuit diagram of a MOS hysteresis comparator circuit according to an embodiment of the present application is shown in FIG. 3. From the following description, the skilled in the art will appreciate that the exemplary hysteresis comparator circuit of FIG. 3 is an embodiment of the hysteresis comparator circuit 200 described above with reference to FIG. 1A.

The embodied hysteresis comparator circuit 200 comprises a differential pair 400 with transistors 210 and 220, which are fed by a current source 300 supplying a source current $I_B$. The transistors 210 and 220 of the differential pair 400 will be also referred to as differential transistors 210 and 220. The current source 300 is arranged to maintain the source current $I_B$ at a constant current value. The source current $I_B$ will be also referred to as comparator biasing current $I_B$. Each of the differential transistors 210 and 220 is connected in series with a respective one of a pair of load transistors 230 and 240. Each serial connection of a differential transistor 210 or 220 and a respective load transistor 230 or 240 will be referred to as comparator leg. The embodied hysteresis comparator circuit 200 comprises a first comparator leg 410 comprising the differential transistor 210 and the load transistor 230 and a second comparator leg 415 comprising the differential transistor 220 and the load transistor 240. For the sake of readability, the comparator legs will be also referred to as "C-leg".

In an example, the differential transistors 210 and 220 are matched as are the load transistors 230 and 240. Herein, matched transistors mean that the transistors have the same or at least substantially the same properties.

An input voltage $V_{in}$ is applied to one of an input $V_n$ 215 and an input $V_p$ 225, and a reference voltage $V_{ref}$ is applied to the other one of the input $V_n$ 215 and the input $V_p$ 225. The input $V_n$ 215 and input $V_p$ 225 are connected to the respective control terminals of the differential transistors 210 and 220. The comparator biasing current $I_B$ is variably divided by the differential pair 400 between the differential transistors 210 and 220 depending on the relative magnitudes of the voltages at the input $V_n$ 215 and the input $V_p$ 225.

An output stage comprises output stage transistors 260, 265, 270 and 275, which are arranged in so-called output stage legs also referred to as OS-legs for the sake of readability. A first OS-leg 420 comprises first and second output stage transistors 260 and 270 connected in series and a second OS-leg 425 comprises first and second output stage transistors 265 and 275 connected in series. The output stage transistors 260, 265, 270 and 275 are also referred to as OS-transistors 260, 265, 270 and 275.

The output stage is connected to the first C-leg at junction node 280 and to the second C-leg at junction node 285.

The first OS-leg 420 is connected to the second OS-leg 425 at junction node 261 connected in series between the OS-transistors 260 and 270 of the first OS-leg 420. Control terminals of the OS-transistor 260 of the first OS-leg 420 and the OS-transistor 265 of the second OS-leg 425 are connected to the junction node 261 and a current terminal of the OS-transistor 260 of the first OS-leg 420, herein the drain terminal. The OS-transistor 260 of the first OS-leg 420 and the OS-transistor 265 of the second OS-leg 425 are connected to form a current mirror.

The first C-leg 410 is connected to the first OS-leg 420 at junction node 280 connected in series between the differential transistor 210 and the load transistor 230 of the first C-leg 410. The control terminals of the OS-transistor 270 of the first OS-leg 420 and the load transistor 230 of the first C-leg 410 are connected to the junction node 280 and a current terminal of the load transistor 230 of the first C-leg 410, herein the drain terminal. The OS-transistor 270 of the first OS-leg 420 and the load transistor 230 of the first C-leg 410 form a current mirror. The current conducted through the load transistor 230 of the first C-leg 410 is referred to as current $I_D$, in FIG. 3. Analogously, the second C-leg 415 is connected to the second OS-leg 425 at junction node 285 connected in series between the differential transistor 220 and the load transistor 240 of the second C-leg 415. The control terminals of the OS-transistor 275 of the second OS-leg 425 and the load transistor 240 of the second C-leg 415 are connected to the node 285 and a current terminal of the load transistor 240 of the second C-leg 415, herein the drain terminal. The OS-transistor 275 of the second OS-leg 425 and the load transistor 240 of the second C-leg 415 form a current mirror. The current conducted through the load transistor 240 of the second C-leg 415 is referred to as current $I_{D2}$ in FIG. 3.

In an example, the load transistor 230 of the first C-leg 410 and the OS-transistor 270 of the first OS-leg 420 are matched; the load transistor 240 of the second C-leg 415 and the OS-transistor 275 of the second OS-leg 425 are matched; and/or the OS-transistor 260 of the first OS-leg 420 and the OS-transistor 265 of the second OS-leg 425 are matched.

In an example, source terminals of the differential transistors 210 and 220 of the C-legs 410 and 415 are connected together and the comparator biasing current $I_B$ is supplied thereto. Source terminals of the load transistors 230 and 240 of the C-legs 410 and 420 are connected to a reference potential, in particular ground. Drain terminals of the differential transistors 210 and 220 of the C-legs 410 and 415 are connected to respective drain terminals of the load transistors 230 and 240 of the C-legs 410 and 415.

The hysteresis characteristic at the switching point of the MOS comparator circuit is caused by injecting a current $I_{hys}$ referred hereto as hysteresis current $I_{hys}$. The hysteresis current $I_{hys}$ is injected into the first C-leg 410 at hysteresis current node 255 or into second C-leg 415 at hysteresis current node 256 depending on the output voltage $V_{out}$ of the hysteresis comparator circuit 200. The hysteresis current node 255 is arranged in series between the differential transistor 210 and the load transistor 230 of the first C-leg 410 and in particular in series between the differential transistor 210 and the junction node 280 of the first C-leg 410. The hysteresis current node 256 is arranged in series between the differential transistor 220 and the load transistor 240 of the second C-leg 415 and in particular in series between the differential transistor 220 and the junction node 285 of the second C-leg 415. For the sake of illustration, the hysteresis current $I_{hys}$ is injected into the first C-leg 410 when the output voltage $V_{out}$ of the embodied hysteresis comparator circuit 200 is high and the hysteresis current $I_{hys}$ is injected into the second C-leg 415 when the output voltage $V_{out}$ of the embodied hysteresis comparator circuit 200 is low.

A single-pole double-throw switch 250 may be implemented to selectively connect a hysteresis current source 100 feeding the hysteresis current $I_{hys}$ into the first C-leg 410 or the second C-leg 415 at the respective one of the hysteresis current nodes 255 and 256. The switching state of the switch 250 is controlled depending on the level of the output voltage $V_{out}$ of the hysteresis comparator circuit 200. It should be noted that in case of a single-pole double-throw switch 250 precautions should be taken to prevent from injecting the hysteresis current $I_{hys}$ into both C-legs 410 and 415 at the same time. The single-pole double-throw switch 250 may be implemented on the basis of a non-overlapping switching circuit, for example, which ensures that the hysteresis current $I_{hys}$ is injected either into the first C-leg 410 or the second C-leg 415.

The output voltage $V_{out}$ is developed by the output stage at an output node 295 arranged in series between the first OS-transistor 265 and the second OS-transistor 275 of the second OS-leg 425. A buffer 290 may be connected to the output node 295 to generate the output voltage $V_{out}$ and/or to isolate the hysteresis comparator circuit 200 from upstream connected circuitries. In an example, the buffer 290, which may be digital buffer. Herein, a mirror current is conducted through the first OS-transistor 265 of the second OS-leg 425, which substantially corresponds to the current $I_{D1}$, and a mirror current is conducted through the first OS-transistor 275 of the second OS-leg 425, which substantially corresponds to the current $I_{D2}$. In output voltage $V_{out}$ is developed, depending on which one of the mirror currents is greater.

In case of a preferred path of the current flow through the first C-leg 410 (e.g. $I_{D1} \approx I_B + I_{hys}$ and $I_{D2} \approx 0$), the OS-transistors 270 and 260 of the first OS-leg 420 and the OS-transistor 265 of the second OS-leg 425 are turned on or at least substantially turned on, whereas the OS-transistor 275 of the second OS-leg 425 is turned off or at least substantially turned off. In this condition, the output node 295 is at a high potential.

In case of a preferred path of the current flow through the second C-leg 415 (e.g. $I_{D2} \approx I_B + I_{hys}$ and $I_{D1} \approx 0$), the OS-transistors 270 and 260 of the first OS-leg 420 and the OS-transistor 265 of the second OS-leg 425 are turned off or at least substantially turned off, whereas the OS-transistor 275 of the second OS-leg 425 is turned on or at least substantially turned on. In this condition, the output node 295 is at ground potential or substantially at ground potential, which means the output node 295 is at a low potential.

The hysteresis voltage $V_{hys}$ can be calculated at the switching point, i.e. when the same current is conducted through the load transistors 230 and 240: $I_{D1} = I_{D2}$. Following equations can be set up for the currents through the differential transistors 210 and 220 in case the same current is conducted through the first and second load transistors 230 and 240.

$$I_{SD\text{-}D1} = \frac{I_B - I_{hys}}{2} = I_{SD\text{-}D2} - I_{hys}$$

$$I_{SD\text{-}D2} = \frac{I_B + I_{hys}}{2} = I_{SD\text{-}D1} + I_{hys}$$

where $I_{SD\text{-}D1}$: source-drain current through the first differential transistor 210;

$I_{SD\text{-}D2}$: source-drain current through the second differential transistor 220;

$I_B$: comparator biasing current; and $I_{hys}$: hysteresis current, wherein $I_{D2} = I_{SD\text{-}D2}$ $I_{D1} = I_{SD\text{-}D1} + I_{hys}$ $I_{SD\text{-}D2} + I_{SD\text{-}D1} = I_B$ $I_{SD\text{-}D2} - I_{SD\text{-}D1} = I_{hys}$ Hence, it is assumed that the hysteresis current $I_{hys}$ is injected into the first comparator leg of the hysteresis comparator circuit 200 without loss of generality of the following considerations.

In the following, it is assumed that the quadratic model of MOS transistors is applicable to calculate the source-gate voltages of the first and second differential transistors 210 and 220:

$$(V_{SG\text{-}D1} - V_{PC})^2 = 2 \cdot \frac{I_{SD\text{-}D1}}{\beta_{P1}}$$

$$V_{SG\text{-}D1} = \sqrt{\frac{2 \cdot I_{SD\text{-}D1}}{\beta_{P1}}} + V_{PC} \text{ and}$$

$$(V_{SG\text{-}D2} - V_{PC})^2 = 2 \cdot \frac{I_{SD\text{-}D2}}{\beta_P}$$

$$V_{SG\text{-}D2} = \sqrt{\frac{2 \cdot I_{SD\text{-}D2}}{\beta_{P1}}} + V_{PC}$$

where $V_{SG\text{-}D1}$: source-gate voltage at the first differential transistor 210;

$V_{SG\text{-}D2}$: source-gate voltage at the second differential transistor 220;

$\beta_{P1}$: transistor constant of the first and second differential transistors 210 and 220, the same transistor constant $\beta_{P1}$ is assumed for the differential transistors 210 and 220; and $V_{PC}$: threshold voltage of the first and second differential transistors 210 and 220, the same threshold voltage $V_{PC}$ is assumed for the differential transistors 210 and 220.

The hysteresis voltage $V_{hys}$ can be expressed as following:

$$V_{hys} = V_{SG-D1} - V_{SG-D2}$$

$$= \sqrt{\frac{2 \cdot I_{SD-D1}}{\beta_{P1}}} + V_{PC} - \left(\sqrt{\frac{2 \cdot I_{SD-D2}}{\beta_{P1}}} + V_{PC}\right)$$

$$= \sqrt{\frac{2 \cdot I_{SD-D1}}{\beta_{P1}}} - \sqrt{\frac{2 \cdot I_{SD-D2}}{\beta_{P1}}}$$

$$= \sqrt{\frac{2}{\beta_{P1}}} \left(\sqrt{\frac{I_B - I_{hys}}{2}} - \sqrt{\frac{I_B + I_{hys}}{2}}\right)$$

$$= \sqrt{\frac{1}{\beta_{P1}}} \left(\sqrt{I_B - I_{hys}} - \sqrt{I_B + I_{hys}}\right)$$

Hence, the hysteresis voltage $V_{hys}$ of the embodied hysteresis comparator circuit 200 is a function of the comparator biasing (supply) current $I_B$, the injected hysteresis current $I_{hys}$ and the transistor constant $\beta_P$ of the differential transistors 210 and 220.

Figure 4:
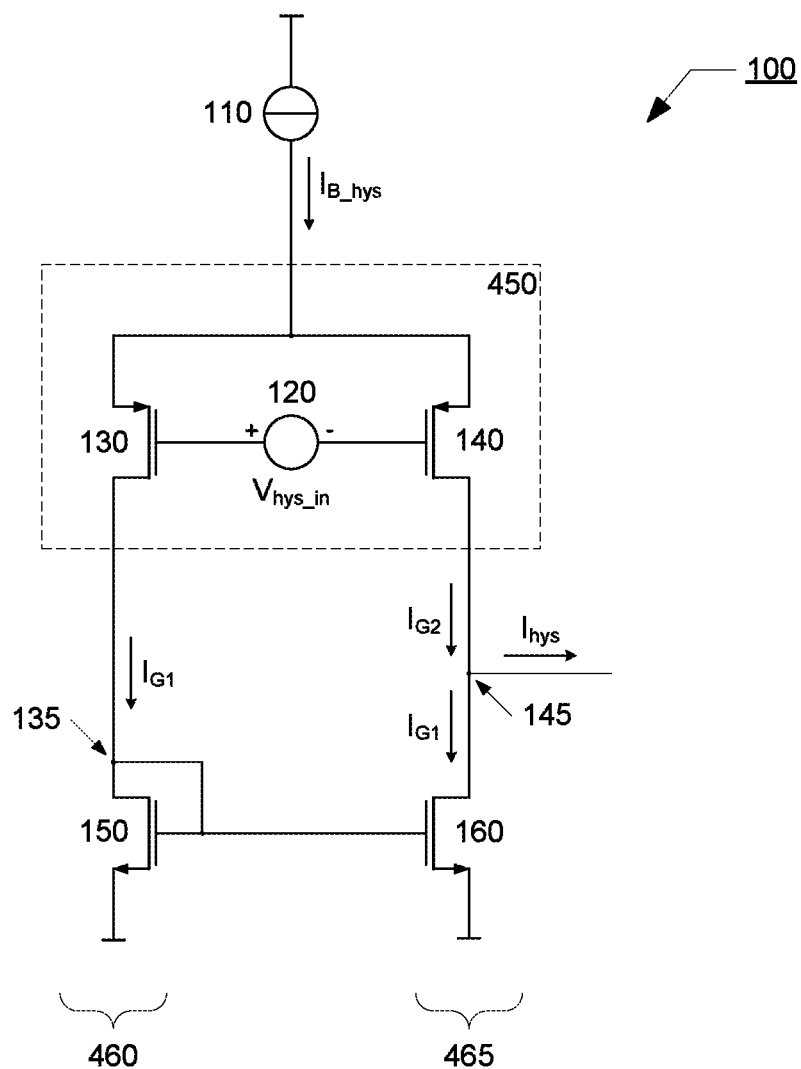
FIG. 4 schematically illustrates a discrete schematic circuit diagram of a MOS hysteresis generating circuit according to an embodiment of the present application.

A discrete schematic circuit diagram of a MOS hysteresis generating circuit according to an embodiment of the present application is shown in FIG. 4. From the following description, the skilled in the art will appreciate that the exemplary hysteresis generating circuit of FIG. 4 is an embodiment of the hysteresis generating circuit 100 described above with reference to FIG. 1A. The embodied hysteresis generating circuit 100 is arranged to provide a hysteresis current $I_{hys}$ for being injected into one of the comparator legs of a MOS hysteresis comparator circuit such as the MOS hysteresis comparator circuit embodied above with reference to FIG. 3.

The hysteresis generating circuit 100 comprises a differential pair 450 with transistors 130 and 140, which are fed by a current source 110 supplying a source current $I_{B-hys}$. The transistors 130 and 140 of the differential pair 450 will be also referred to as differential transistors 130 and 140. The current source 110 is arranged to maintain the source current $I_{B-hys}$ at a constant current value. The source current $I_{B-hys}$ will be also referred to as hysteresis generating circuit biasing current $I_{B-hys}$ or simply as hysteresis biasing current $I_{B-hys}$. Each of the differential transistors 130 and 140 is connected in series with a respective one of a pair of load transistors 150 and 160. Each serial connection of a differential transistor 130 or 140 and a respective load transistor 150 or 160 will be referred to as generator leg. The embodied hysteresis generating circuit 100 comprises a first generator leg 460 comprising the differential transistor 130 and the load transistor 150 and a second generator leg 465 comprising the differential transistor 140 and the load transistor 160. For the sake of readability, the generator legs will be also referred to as "G-leg".

In an example, the differential transistors 130 and 140 are matched as are the load transistors 150 and 160.

In the shown example, a voltage supply 120 provides a hysteresis control voltage $V_{hys-in}$, which is applied to the control terminals of the differential transistors 130 and 140. The voltage supply 120 enforces a differential voltage equal to the hysteresis control voltage $V_{hys-in}$ at the control terminals of the differential transistors 130 and 140. The hysteresis biasing current $I_{B-hys}$ is variably divided by the differential pair 450 between the differential transistors 130 and 140 depending on the relative magnitudes of the applied differential voltage at the control terminals of the differential transistors 130 and 140.

The first G-leg 460 is connected to the second G-leg 465 at junction node 135 connected in series between the differential transistor 130 and the load transistor 150 of the first G-leg 460. The control terminals of the load transistor 150 of the first G-leg 460 and the load transistor 160 of the second G-leg 465 are connected to the junction node 135 and a current terminal of the load transistor 150 of the first G-leg 460, herein the drain terminal. The load transistor 150 of the first G-leg 460 and the load transistor 160 of the second G-leg 465 are connected to form a current mirror.

In an example, source terminals of the differential transistors 130 and 140 of the G-legs 460 and 465 are connected together and the hysteresis biasing current $I_{B-hys}$ is supplied to thereto. Source terminals of the load transistors 150 and 160 of the G-legs 460 and 465 are connected to a reference potential, in particular ground. Drain terminals of the differential transistors 130 and 140 are connected to respective drain terminals of the load transistors 150 and 160 of the G-legs 460 and 465.

The hysteresis current $I_{hys}$ is provided at the second G-leg 465, e.g. at an output node 145 arranged in series between the differential transistor 140 and the load transistor 160 thereof. The embodied hysteresis generating circuit 100 is applicable to provide a proper hysteresis current $I_{hys}$ to a MOS hysteresis comparator circuit such as the example embodied above with reference to FIG. 3. The hysteresis current $I_{hys}$ is a function of the hysteresis control voltage $V_{hys-in}$.

Following equations can be set up for the currents through the first and second differential transistors 130 and 140:

$$I_{SD-G1} = \frac{I_{B-hys} - I_{hys}}{2}$$

$$I_{SD-G2} = \frac{I_{B-hys} + I_{hys}}{2}$$

$$I_{SD-G1} + I_{SD-G2} = \frac{I_{B-hys} + I_{hys}}{2} + \frac{I_{B-hys} - I_{hys}}{2} = I_{B-hys}$$

$$I_{SD-G2} - I_{SD-G1} = \frac{I_{B-hys} + I_{hys}}{2} - \frac{I_{B-hys} - I_{hys}}{2} = I_{hys}$$

$$I_{SD-G2} \cdot I_{SD-G1} = \frac{I_{B-hys} + I_{hys}}{2} \cdot \frac{I_{B-hys} - I_{hys}}{2} = \frac{1}{4}(I_{B-hys}^2 - I_{hys}^2)$$

where $I_{SD-G1}$: source-drain current through the first differential transistor 130 (of the first G-leg 460), also referred to in FIG. 3 as $I_{G1}$;

$I_{SD-G2}$: source-drain current through the second differential transistor 140 (of the second G-leg 465), also referred to in FIG. 3 as $I_{G2}$;

$I_{B-hys}$: hysteresis biasing current; and $I_{hys}$: hysteresis current provided at the output node 145.

In the following, it is also assumed that the quadratic model of MOS transistors is applicable to calculate the source-gate voltages of the differential transistors 210 and 220:

$$(V_{SG-G2} - V_{PH})^2 = 2 \cdot \frac{I_{SD-G2}}{\beta_{P2}}$$

$$V_{SG-G2} = \sqrt{\frac{2 \cdot I_{SD-G2}}{\beta_{P2}}} + V_{PH} \text{ and}$$

$$(V_{SG-G1} - V_{PH})^2 = 2 \cdot \frac{I_{SD-G1}}{\beta_{P2}}$$

-continued
$$V_{SG-G1} = \sqrt{\frac{2 \cdot I_{SD-G1}}{\beta_{P2}}} + V_{PH}$$

where $V_{SG-G2}$: source-gate voltage at the first differential transistor 130;
$V_{SG-G1}$: source-gate voltage at the second differential transistor 140;
$\beta_{P2}$: transistor constant of the first and second differential transistors 130 and 140, the same transistor constant $\beta_{P2}$ is assumed for the differential transistors 130 and 140; and
$V_{PH}$: threshold voltage of the first and second differential transistors 130 and 140, the same threshold voltage $V_{PH}$ is assumed for the differential transistors 130 and 140.

The hysteresis control voltage $V_{hys-in}$ can be expressed as following:

$$V_{hys-in} = V_{SG-G1} - V_{SG-G2}$$
$$= \sqrt{\frac{2 \cdot I_{SD-G1}}{\beta_{P2}}} + V_{PH} - \left(\sqrt{\frac{2 \cdot I_{SD-G2}}{\beta_{P2}}} + V_{PH}\right)$$
$$= \sqrt{\frac{2 \cdot I_{SD-G1}}{\beta_{P2}}} - \sqrt{\frac{2 \cdot I_{SD-G2}}{\beta_{P2}}}$$

This means that $$V_{hys-in}^2 = \left(\sqrt{\frac{2 \cdot I_{SD-G1}}{\beta_{P2}}} - \sqrt{\frac{2 \cdot I_{SD-G2}}{\beta_{P2}}}\right)^2$$
$$= \frac{2 \cdot I_{SD-G1}}{\beta_{P2}} + \frac{2 \cdot I_{SD-G2}}{\beta_{P2}} - 2 \cdot \sqrt{\frac{2 \cdot I_{SD-G1}}{\beta_{P2}}} \sqrt{\frac{2 \cdot I_{SD-G2}}{\beta_{P2}}}$$
$$= \frac{2}{\beta_{P2}} \cdot (I_{SD-G1} + I_{SD-G2}) - \frac{4}{\beta_{P2}} \cdot \sqrt{I_{SD-G1} \cdot I_{SD-G2}}$$
$$= \frac{2}{\beta_{P2}} \left(I_{B-hys} - 2 \cdot \sqrt{I_{SD-G1} \cdot I_{SD-G2}}\right)$$

Replacing the product of source-drain currents $$I_{SD-G2} \cdot I_{SD-G1} = \frac{1}{4}(I_{B-hys}^2 - I_{hys}^2)$$

(see above) results to:

$$V_{hys-in}^2 = \frac{2}{\beta_{P2}} \left(I_{B-hys} - 2\sqrt{I_{SD-G1} \cdot I_{SD-G2}}\right)$$
$$= \frac{2}{\beta_{P2}} \left(I_{B-hys} - 2\sqrt{\frac{1}{4}(I_{B-hys}^2 - I_{hys}^2)}\right)$$
$$= \frac{2}{\beta_{P2}} \left(I_{B-hys} - \sqrt{I_{B-hys}^2 - I_{hys}^2}\right)$$

$$\frac{\beta_{P2}}{2} \cdot V_{hys-in}^2 = I_{B-hys} - \sqrt{I_{B-hys}^2 - I_{hys}^2}$$

$$\sqrt{I_{B-hys}^2 - I_{hys}^2} = I_{B-hys} - \frac{\beta_{P2}}{2} \cdot V_{hys-in}^2$$

$$I_{B-hys}^2 - I_{hys}^2 = I_{B-hys}^2 - 2 \cdot I_{B-hys} \cdot \frac{\beta_{P2}}{2} \cdot V_{hys-in}^2 + \frac{\beta_{P2}^2}{4} \cdot V_{hys-in}^4$$

$$I_{hys}^2 = -\frac{\beta_{P2}^2}{4} \cdot V_{hys-in}^4 + I_{B-hys} \cdot \beta_{P2} \cdot V_{hys-in}^2$$

Solving equation for $I_{hys}$ $$I_{hys}^2 = -\frac{\beta_{P2}^2}{4} \cdot V_{hys-in}^4 + I_{B-hys} \cdot \beta_{P2} \cdot V_{hys-in}^2$$
$$= V_{hys-in}^2 \left(-\frac{\beta_{P2}^2}{4} \cdot V_{hys-in}^2 + \beta_{P2} \cdot I_{B-hys}\right)$$

Solving equation for $V_{hys-in}^2$ $$-\frac{\beta_{P2}^2}{4} \cdot V_{hys-in}^4 + I_{B-hys} \cdot \beta_{P2} \cdot V_{hys-in}^2 - I_{hys}^2 = 0$$

$$V_{hys-in}^4 - 4 \cdot \frac{I_{B-hys}}{\beta_{P2}} \cdot V_{hys-in}^2 + 4 \cdot \frac{I_{hys}^2}{\beta_{P2}^2} = 0$$

Remark: Solving a quadratic equation $$x^2 + px + q = 0$$

$$x = -\frac{p}{2} \pm \sqrt{\left(\frac{p}{2}\right)^2 - q}$$

Solving the quadratic equation for $V_{hys-in}^2$ $$V_{hys-in}^4 - 4 \cdot \frac{I_{B-hys}}{\beta_{P2}} \cdot V_{hys-in}^2 + 4 \cdot \frac{I_{hys}^2}{\beta_{P2}^2} = 0$$

wherein $$\frac{p}{2} = -2 \cdot \frac{I_{B-hys}}{\beta_{P2}}$$

$$q = 4 \cdot \frac{I_{hys}^2}{\beta_{P2}^2}$$

Hence, $$V_{hys-in}^2 = -\frac{p}{2} \pm \sqrt{\left(\frac{p}{2}\right)^2 - q}$$
$$= \frac{2 \cdot I_{B-hys}}{\beta_{P2}} \pm \sqrt{\frac{4 \cdot I_{B-hys}^2}{\beta_{P2}^2} - \frac{4 \cdot I_{hys}^2}{\beta_{P2}^2}}$$
$$= \frac{2}{\beta_{P2}} \left(I_{B-hys} \pm \sqrt{I_{B-hys}^2 - I_{hys}^2}\right)$$

Figure 5:
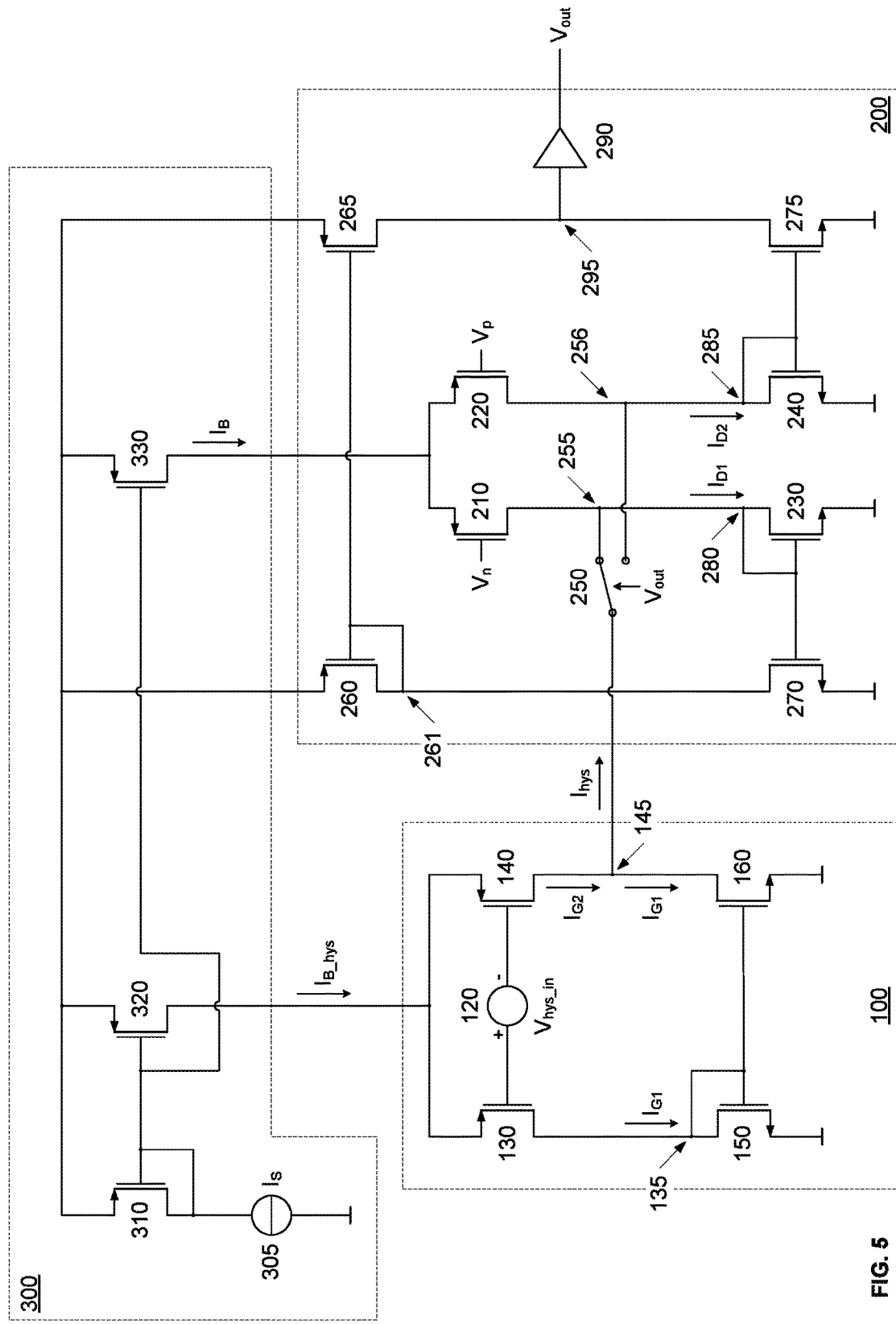
FIG. 5 schematically illustrates a discrete schematic circuit diagram of a hysteresis comparator, which includes a MOS hysteresis generating circuit of FIG. 4 connected to a MOS hysteresis comparator circuit of FIG. 3, according to an embodiment of the present application.

A discrete schematic circuit diagram of a hysteresis comparator according to another embodiment of the present invention including a MOS hysteresis generating circuit connected to a MOS hysteresis comparator circuit is shown in FIG. 5. The circuitry comprises the MOS hysteresis comparator circuit as embodied above with reference to FIG. 3 and the hysteresis generating circuit as embodied above with reference to FIG. 4.

The circuitry embodied herein with reference to FIG. 5 further comprises a common current source circuitry 300, which supplies the comparator biasing current $I_B$ and the hysteresis biasing current $I_{B\text{-}hys}$. Particularly, the current source circuitry 300 comprises a common current source 305 supplying a biasing current $I_S$ and a current mirror circuitry including the transistors 310, 320 and 330 to supply the same current to the hysteresis comparator circuit 200 and the hysteresis generating circuit 100. In particular, the transistor 320 is a current source transistor feeding the hysteresis generating circuit 100 and the transistor 330 is a current source transistor feeding the hysteresis comparator circuit 200. In an example, the transistors 320 and 330 are matched.

The hysteresis voltage $V_{hys}$ can be expressed as a function of the hysteresis control voltage $V_{hys\text{-}in}$ as shown in the following.

As already described in the context of the MOS hysteresis comparator circuit embodied above with reference to FIG. 3:

$$V_{hys} = \sqrt{\frac{1}{\beta_{P1}}} \left( \sqrt{I_B - I_{hys}} - \sqrt{I_B + I_{hys}} \right)$$

Hence, $$V_{hys}^2 = \frac{1}{\beta_{P1}} \left( \sqrt{I_B - I_{hys}} - \sqrt{I_B + I_{hys}} \right)^2$$

$$= \frac{1}{\beta_{P1}} \left( I_B - I_{hys} - 2\sqrt{I_B - I_{hys}} \sqrt{I_B + I_{hys}} + I_B + I_{hys} \right)$$

$$= \frac{2}{\beta_{P1}} \left( I_B - \sqrt{I_B^2 - I_{hys}^2} \right)$$

As already described in the context with the hysteresis generating circuit embodied above with reference to FIG. 4:

$$I_{hys}^2 = -\frac{\beta_{P2}^2}{4} \cdot V_{hys\text{-}in}^4 + I_{B\text{-}hys} \cdot \beta_{P2} \cdot V_{hys\text{-}in}^2$$

Provided that the same current is supplied to the hysteresis comparator circuit 200 and the hysteresis generating circuit 100, which means that the hysteresis biasing current $I_{B\text{-}hys}$ and the comparator biasing current $I_B$ is the same current, i.e. $I_{bias}=I_B=I_{B\text{-}hys}$, and assuming that the transistor constant $\beta_{P2}$ of the differential transistors 130 and 140 of the hysteresis generating circuit 100 and the transistor constant $\beta_{P1}$ of differential transistors 210 and 220 of the hysteresis comparator circuit 200 is the same, i.e. $\beta_P=\beta_{P2}=\beta_{P1}$:

$$V_{hys}^2 = \frac{2}{\beta_P} \left( I_{bias} - \sqrt{I_{bias}^2 + \frac{\beta_P^2}{4} \cdot V_{hys\text{-}in}^4 - I_{bias} \cdot \beta_P \cdot V_{hys\text{-}in}^2} \right)$$

$$= \frac{2}{\beta_P} \left( I_{bias} - \sqrt{\left( I_{bias} - \frac{\beta_P}{2} \cdot V_{hys\text{-}in}^2 \right)^2} \right)$$

$$= \frac{2}{\beta_P} \left( I_{bias} - \left( I_{bias} - \frac{\beta_P}{2} \cdot V_{hys\text{-}in}^2 \right) \right)$$

Hence, $$V_{hys}^2 = \frac{2}{\beta_P} \left( I_{bias} - I_{bias} + \frac{\beta_P}{2} \cdot V_{hys\text{-}in}^2 \right)$$

$$= V_{hys\text{-}in}^2$$

$$V_{hys} = V_{hys\text{-}in}$$

The above result may be also obtained by comparing the hysteresis voltage $V_{hys}$ the hysteresis control voltage $V_{hys\text{-}in}$:

$$V_{hys}^2 = \frac{2}{\beta_{P1}} \left( I_B - \sqrt{I_B^2 - I_{hys}^2} \right)$$

$$V_{hys\text{-}in}^2 = \frac{2}{\beta_{P2}} \left( I_{B\text{-}hys} \pm \sqrt{I_{B\text{-}hys}^2 - I_{hys}^2} \right)$$

Provided again that the same current is supplied to the hysteresis comparator circuit 200 and the hysteresis generating circuit 100, which means that the hysteresis biasing current $I_{B\text{-}hys}$ and the comparator biasing current $I_B$ is the same current, i.e. $I_{bias}=I_B=I_{B\text{-}hys}$, and assuming again that the transistor constant $\beta_{P2}$ of the differential transistors 130 and 140 of the hysteresis generating circuit 100 and the transistor constant $\beta_{P1}$ of the differential transistors 210 and 220 of the hysteresis comparator circuit 200 is the same, i.e. $\beta_P=\beta_{P2}=\beta_{P1}$:

$$V_{hys}^2 = \frac{2}{\beta_P} \left( I_{bias} - \sqrt{I_{bias}^2 - I_{hys}^2} \right)$$

$$V_{hys\text{-}in}^2 = \frac{2}{\beta_P} \left( I_{bias} - \sqrt{I_{bias}^2 - I_{hys}^2} \right)$$

Hence, $$V_{hys}=V_{hys\text{-}in}$$

In case of the above assumptions, the hysteresis voltage $V_{hys}$ is equal to the hysteresis control voltage $V_{hys\text{-}in}$. The hysteresis voltage $V_{hys}$ can be directly set by accordingly adjusting the hysteresis control voltage $V_{hys\text{-}in}$.

In the above example, the sizing of the differential stage of the hysteresis generating circuit 100, i.e. the sizing of the differential transistors thereof, and the sizing of the differential stage of the hysteresis comparator circuit 200, i.e. the sizing of the differential transistors thereof, has been assumed to be the same ($\beta_P=\beta_{P2}=\beta_{P1}$). This results to a one-to-one relation between the hysteresis control voltage $V_{hys\text{-}in}$ and the hysteresis voltage $V_{hys}$.

Those skilled in the art will understand that the present application is not limited to the above described embodiments. For instance, the transistor constant $\beta_{P2}$ of the differential transistors 130 and 140 of the hysteresis generating circuit 100 and the transistor constant $\beta_{P1}$ of the differential transistors 210 and 220 of the hysteresis comparator circuit 200 may be different, e.g.

$$\beta_{P1}=\beta_P$$

$$\beta_{P2}=\alpha^2 \cdot \beta_P$$

Thus, $$V_{hys}^2 = \frac{2}{\beta_{P1}}\left(I_B - \sqrt{I_B^2 - I_{hys}^2}\right)$$

$$= \frac{2}{\beta_P}\left(I_B - \sqrt{I_B^2 - I_{hys}^2}\right)$$

$$V_{hys\text{-}in}^2 = \frac{2}{\beta_{P2}}\left(I_{B\text{-}hys} - \sqrt{I_{B\text{-}hys}^2 - I_{hys}^2}\right)$$

$$= \frac{2}{\alpha^2 \cdot \beta_P}\left(I_{B\text{-}hys} - \sqrt{I_{B\text{-}hys}^2 - I_{hys}^2}\right)$$

Provided again that the hysteresis biasing current $I_{B\text{-}hys}$ and the comparator biasing current $I_B$ is the same current, i.e. $I_{bias} = I_B = I_{B\text{-}hys}$:

$$V_{hys}^2 = \frac{2}{\beta_P}\left(I_{bias} - \sqrt{I_{bias}^2 - I_{hys}^2}\right)$$

$$\alpha^2 \cdot V_{hys\text{-}in}^2 = \frac{2}{\beta_P}\left(I_{bias} - \sqrt{I_{bias}^2 - I_{hys}^2}\right)$$

Hence, the hysteresis voltage $V_{hys}$ results to $$V_{hys} = \alpha \cdot V_{hys\text{-}in}$$

$$\alpha = \sqrt{\frac{\beta_{P2}}{\beta_{P1}}}$$

where $\beta_{P1}$: transistor constant of the first and second differential transistors 210 and 220 of the hysteresis comparator circuit 200; the same transistor constant $\beta_{P1}$ is assumed for the differential transistors 210 and 220; and $\beta_{P2}$: transistor constant of the first and second differential transistors 130 and 140 of the hysteresis generating circuit 100; the same transistor constant $\beta_{P2}$ is assumed for the differential transistors 130 and 140.

In the above example, the sizing of the differential stage of the hysteresis generating circuit 100, i.e. the sizing of the differential transistors thereof, and the sizing of the differential stage of the hysteresis comparator circuit 200, i.e. the sizing of the differential transistors thereof, has been assumed to be different ($\beta_{P2} = \alpha^2 \cdot \beta_{P1}$). This results to a predefined relation between the hysteresis control voltage $V_{hys\text{-}in}$ and the hysteresis voltage $V_{hys}$ dependent on the sizing of the differential stage of the hysteresis generating circuit 100 and the sizing of the differential stage of the hysteresis comparator circuit 200, which allows to reduce the area required by the hysteresis comparator circuit 200 at design time.

Figure 6:
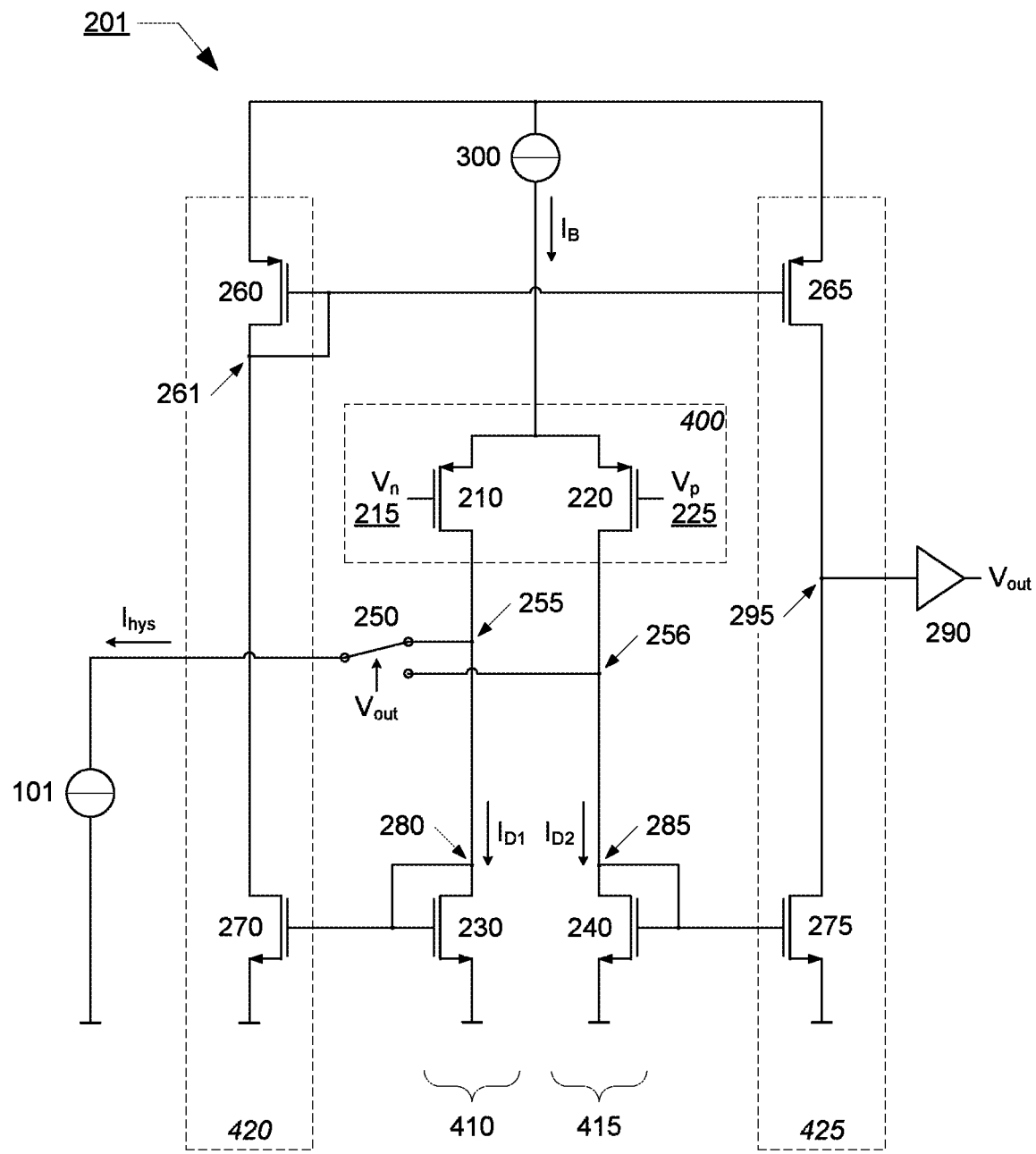
FIG. 6 schematically illustrates a discrete schematic circuit diagram of a MOS hysteresis comparator circuit according to another embodiment of the present application.

A discrete schematic circuit diagram of a MOS hysteresis comparator circuit according to another embodiment of the present application is shown in FIG. 6. From the following description, the skilled in the art will appreciate that the exemplary hysteresis comparator circuit of FIG. 6 is an embodiment of the hysteresis comparator circuit 201 described above with reference to FIG. 1B.

The embodied hysteresis comparator circuit 201 substantially corresponds to the hysteresis comparator circuit 200 described above with reference to FIG. 3. In particular, the implementation of the hysteresis comparator circuit 200 and the hysteresis comparator circuit 201 substantially corresponds to each other. The embodied hysteresis comparator circuit 201 of FIG. 6 differs from the hysteresis comparator circuit 200 of FIG. 3 in that the hysteresis current $I_{hys}$, which establishes the hysteresis characteristic, is not selectively injected in the comparator legs but is selectively drawn from the comparator legs dependent of the level of the output voltage signal $V_{out}$.

Those skilled in the art will immediately understand that the above description of the hysteresis comparator circuit 200 with reference to FIG. 3 can be correspondingly transferred to the embodied hysteresis comparator circuit 201. For the sake of illustration, the hysteresis current $I_{hys}$ is drawn from the first comparator leg when the output voltage $V_{out}$ of the embodied hysteresis comparator circuit 201 is low and the hysteresis current $I_{hys}$ is drawn from the second comparator leg when the output voltage $V_{out}$ of the embodied hysteresis comparator circuit 201 is high.

In particular, the hysteresis voltage $V_{hys}$ can be analogously calculated at the switching point, i.e. when the same current is conducted through the load transistors 230 and 240: $I_{D1} = I_{D2}$. Following equations can be set up for the currents through the differential transistors 210 and 220 in case the same current is conducted through the load transistors 230 and 240.

$$I_{SD\text{-}D1} = \frac{I_B - I_{hys}}{2} = I_{SD\text{-}D2} - I_{hys}$$

$$I_{SD\text{-}D2} = \frac{I_B + I_{hys}}{2} = I_{SD\text{-}D1} + I_{hys}$$

where $I_{SD\text{-}D1}$: source-drain current through the first differential transistor 210;

$I_{SD\text{-}D2}$: source-drain current through the second differential transistor 220;

$I_B$: comparator biasing current; and $I_{hys}$: hysteresis current, wherein $I_{D2} = I_{SD\text{-}D2} - I_{hys}$ $I_{D1} = I_{SD\text{-}D1}$ Hence, it is assumed that the hysteresis current $I_{hys}$ is drawn from the second comparator leg of the hysteresis comparator circuit 201 without loss of generality of the following considerations.

The considerations regarding the source-gate voltages of the differential transistors 210 and 220 are that same such that in analogy to the aforementioned the hysteresis voltage $V_{hys}$ results to:

$$V_{hys} = V_{SG\text{-}D1} - V_{SG\text{-}D2}$$

$$= \sqrt{\frac{1}{\beta_{P1}}}\left(\sqrt{I_B - I_{hys}} - \sqrt{I_B + I_{hys}}\right)$$

where $V_{SG\text{-}D1}$: source-gate voltage at the first differential transistor 210;

$V_{SG\text{-}D2}$: source-gate voltage at the second differential transistor 220; and $\beta_{P1}$: transistor constant of the first and second differential transistors 210 and 220 of the hysteresis comparator circuit 201, the same transistor constant $\beta_{P1}$ is assumed for the differential transistors 210 and 220.

Figure 7:
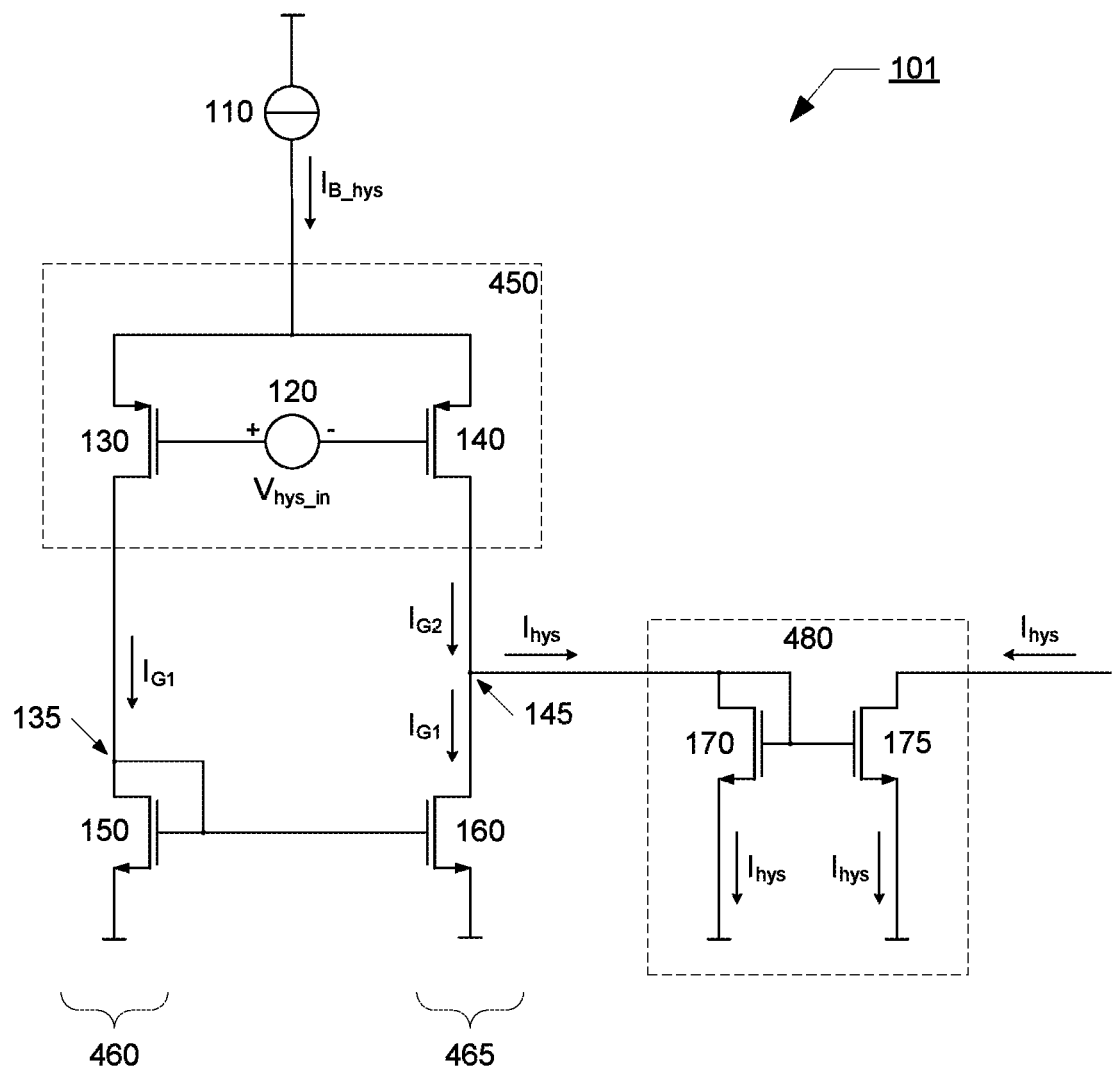
FIG. 7 schematically illustrates a discrete schematic circuit diagram of a MOS hysteresis generating circuit according to another embodiment of the present application.

A discrete schematic circuit diagram of a MOS hysteresis generating circuit according to another embodiment of the present application is shown in FIG. 7. From the following description, the skilled in the art will appreciate that the exemplary hysteresis generating circuit of FIG. 7 is an embodiment of the hysteresis generating circuit 101 described above with reference to FIG. 1B.

The embodied hysteresis generating circuit 101 substantially corresponds to the hysteresis generating circuit 100 described above with reference to FIG. 4. In particular, the implementation of the hysteresis generating circuit 100 and the hysteresis generating circuit 101 substantially corresponds to each other.

The embodied hysteresis generating circuit 101 of FIG. 7 differs from the hysteresis generating circuit 100 of FIG. 4 in that the hysteresis generating circuit 101 further comprises a current mirror circuit 480, which is configured to enable drawing the hysteresis current $I_{hys}$, which establishes the hysteresis characteristic, from the aforementioned hysteresis comparator circuit 201. The current mirror circuit 480 of the embodied hysteresis generating circuit 101 comprises a transistor 170 and a transistor 175. The current mirror circuit 480 shown in FIG. 7 is illustrative. Other current mirror circuit implementations may be likewise used in the circuit design of the of the hysteresis generating circuit 101 of FIG. 7. In particular, variations of the illustrated basic current mirror circuit 480 may be used such as Wilson current mirror topology with three or four transistors.

Those skilled in the art will immediately understand that the above description of the hysteresis generating circuit 100 with reference to FIG. 4 can be correspondingly transferred to the embodied hysteresis generating circuit 101. A repetition is omitted.

Figure 8:
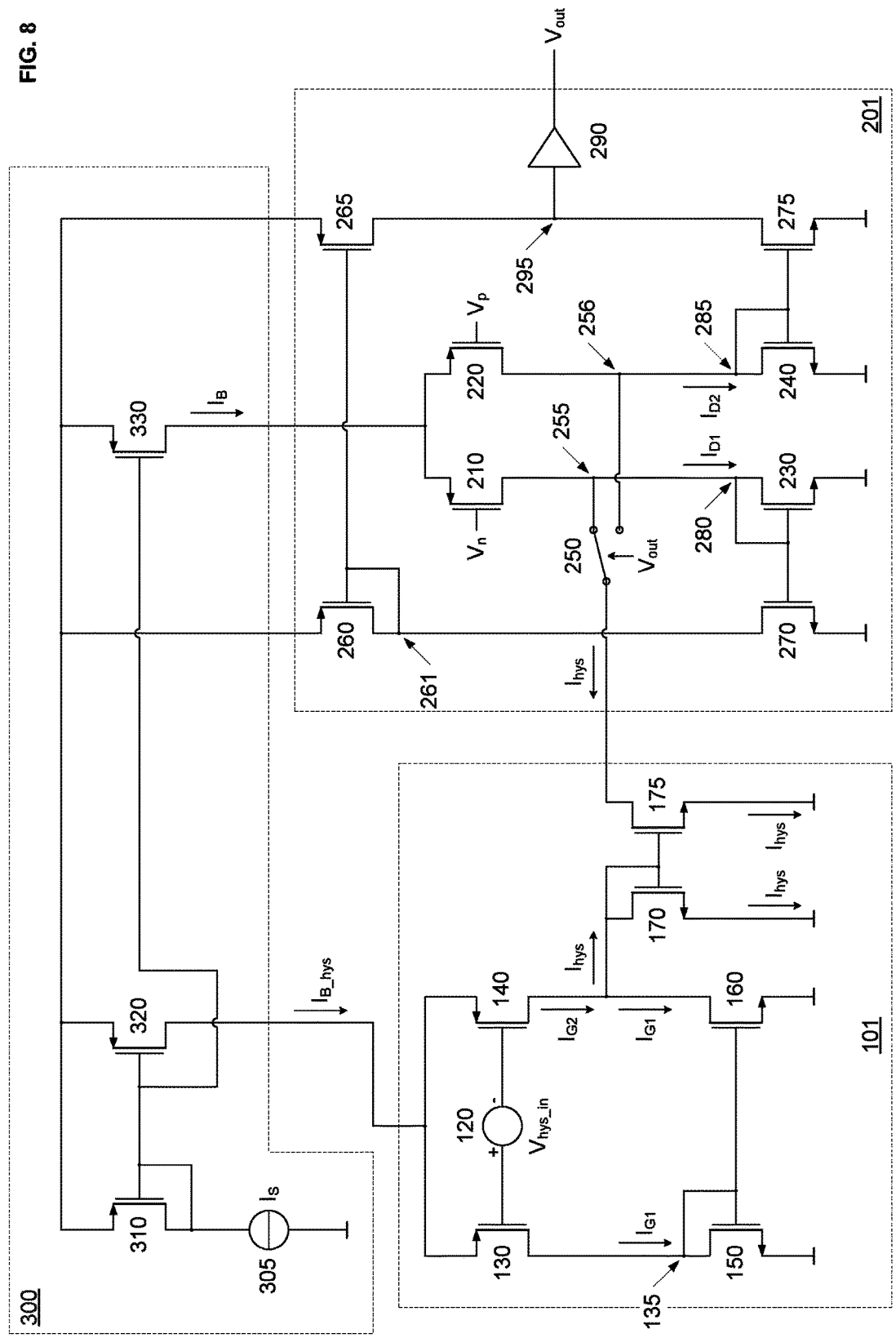
FIG. 8 schematically illustrates a discrete schematic circuit diagram of a hysteresis comparator, which includes a MOS hysteresis generating circuit of FIG. 7 connected to a MOS hysteresis comparator circuit of FIG. 6, according to another embodiment of the present application.

A discrete schematic circuit diagram of a hysteresis comparator according to another embodiment of the present including a MOS hysteresis generating circuit connected to a MOS hysteresis comparator circuit application is shown in FIG. 8. The circuitry comprises the MOS hysteresis comparator circuit as embodied above with reference to FIG. 6 and the hysteresis generating circuit as embodied above with reference to FIG. 7. The circuitry embodied herein with reference to FIG. 8 further comprises a common current source circuitry 300, which supplies the comparator biasing current $I_B$ and the hysteresis biasing current $I_{B\text{-}hys}$.

From the above considerations, those skilled in the art will immediately understand that the above description of the hysteresis comparator with reference to FIG. 5 can be analogously transferred to the hysteresis comparator of FIG. 8. A repetition is omitted.

In particular, the hysteresis voltage $V_{hys}$ likewise results to $$V_{hys} = \alpha \cdot V_{hys\text{-}in}$$

$$\alpha = \sqrt{\frac{\beta_{P2}}{\beta_{P1}}}$$

where $\beta_{P1}$: transistor constant of the first and second differential transistors 210 and 220 of the hysteresis comparator circuit 201, the same transistor constant $\beta_{P1}$ is assumed for the differential transistors 210 and 220; and $\beta_{P2}$: transistor constant of the first and second differential transistors 130 and 140 of the hysteresis generating circuit 101, the same transistor constant $\beta_{P2}$ is assumed for the differential transistors 130 and 140.

In the above described hysteresis comparators, the differential transistors 210, 220, 130 and 140 of the exemplary hysteresis comparator circuits 200 and 201 and the exemplary hysteresis generating circuits 100, 101 are illustrated to be p-channel MOS (PMOS) transistors. Those skilled in the art will immediately understood that the n-channel MOS (NMOS) transistors may be likewise used to implement the pairs of differential transistors used in a hysteresis comparator circuit and a hysteresis generating circuit according to embodiments of the present application.

The hysteresis comparator as described above is a basic block in analog electronics and can be used in a huge variety of applications. For instance, a hysteresis comparator may be used in an RF (radio frequency) detector to detect RF disturbances on a communication link. The above described hysteresis comparator shows several advantages:

(1) The suggested hysteresis comparator is suited for application subjected to large temperature and/or voltage variations such as automotive applications. The PVT compensation is obtained by a PVT compensated hysteresis current $I_{hys}$, which is injected into or drawn from the hysteresis comparator circuit.

In testing of the subject implementation over temperature variation, the suggested hysteresis characteristic of the suggested hysteresis comparator was maintained relatively constant, within approximately 2% of the nominal hysteresis voltage $V_{hys}$ in a temperature range from −40° C. to 175° C.

(2) The suggested hysteresis comparator enables an adjustable hysteresis characteristic. The hysteresis voltage $V_{hys}$ is adjustable by adjusting the hysteresis control voltage $V_{hys\text{-}in}$. The hysteresis control voltage $V_{hys\text{-}in}$ may be made controllable by an external entity, for instance using a configurable digital register and an analog-to-digital converter for controlling the hysteresis control voltage $V_{hys\text{-}in}$. Accordingly, the hysteresis voltage $V_{hys}$ is set by controlling the hysteresis control voltage $V_{hys\text{-}in}$. In particular, the hysteresis voltage $V_{hys}$ is a function of the hysteresis control voltage $V_{hys\text{-}in}$ and a scaling factor $\alpha$ only. More particular, the scaling factor $\alpha$ is a constant, which is defined at design time of the hysteresis comparator. The scaling factor $\alpha$ is in particular defined by the sizing of the differential transistors.

(3) The suggested hysteresis comparator enables an asymmetrical and adjustable hysteresis characteristic. For instance, the hysteresis control voltage $V_{hys\text{-}in}$ may be switched between two different levels based on the level (voltage magnitude) of the output voltage signal $V_{out}$ of the hysteresis comparator. Each level is for instance associated with one of a high state and low state of the output voltage signal $V_{out}$, which in turn yields to an asymmetrical hysteresis characteristic with respect to rising and falling edges of the output voltage signal $V_{out}$.

(4) The suggested hysteresis comparator is suited for input signals ($V_p$ and $V_n$), which are sensitive to loading. The input impedance is mainly capacitive and it is determined by the input impedance of the differential pair of the hysteresis comparator circuit.

(5) The suggested hysteresis comparator and in particular the hysteresis comparator circuit has a simplified design in that an analog feedback loop (such as a resistive feedback), an error amplifier and/or a start-up circuit is not required. The number of transistors is kept at a minimum, which yields to a significant reduction of the area requirement.

According to an embodiment, a hysteresis comparator is provided, which comprises a hysteresis comparator circuit and a hysteresis generating circuit.

The hysteresis comparator circuit comprises two comparator legs each with a differential transistor and a load transistor and an output stage. The differential transistors of the two comparator legs are connected to receive a comparator biasing current $I_B$ and are configured for variably dividing the comparator biasing current $I_B$ based on the relative levels of the voltage signals $V_p$, $V_n$ applied to control terminals of the differential transistors of the two comparator legs. The output stage is configured for developing an output voltage signal $V_{out}$ based on currents $I_{D1}$, $I_{D2}$ flowing through the load transistors of the two comparator legs.

The hysteresis generating circuit is configured for selectively injecting a hysteresis current $I_{hys}$ in or for selectively drawing the hysteresis current $I_{hys}$ from either one of the two comparator legs depending on the level of the output voltage signal $V_{out}$. A hysteresis voltage $V_{hys}$ of the hysteresis comparator circuit is a function of the hysteresis current $I_{hys}$.

In an example, the hysteresis current $I_{hys}$ injected in one of the two comparator legs increases a current $I_{D1}$, $I_{D2}$ flowing through the load transistor of the respective comparator leg.

In an example, the hysteresis current $I_{hys}$ drawn from one of the two comparator legs decreases a current $I_{D1}$, $I_{D2}$ flowing through the load transistor of the respective comparator leg.

In an example, the hysteresis current $I_{hys}$ selectively injected in either one of the two comparator legs establishes a switching point of the output voltage signal $V_{out}$ when the difference of the voltage signals $V_p$, $V_n$ input to the differential transistors corresponds to the hysteresis voltage $V_{hys}$.

In an example, the hysteresis current $I_{hys}$ selectively drawn from either one of the two comparator legs establishes a switching point of the output voltage signal $V_{out}$ when the difference of the voltage signals $V_p$, $V_n$ input to the differential transistors corresponds to the hysteresis voltage $V_{hys}$.

In an example, the hysteresis comparator circuit further comprises a switch arranged to selectively connect the hysteresis generating circuit with either one of the comparator legs depending on the level of the output voltage signal $V_{out}$.

In an example, each of the two comparator legs comprises a hysteresis current node connected in series between the differential transistor and the load transistor of the respective one of the two comparator leg.

In an example, the output stage comprises two output stage legs, each of which is coupled to another one of the two comparator legs.

In an example, each of the two output stage legs comprises a first transistor and a second transistor. The first transistors of the two output stage legs are connected to form a current mirror. The second transistors of the two output stage legs are connected to another one of the load transistors of the two comparator legs, wherein each pair of second transistor and load transistor is configured to form a current mirror.

In an example, the hysteresis comparator circuit further comprises a buffer, which input is coupled to an output node connected in series between the transistors of one of the output stage legs. The buffer is configured to output the output voltage signal $V_{out}$.

In an example, source terminals of the differential transistors of the two comparator legs are connected together. The comparator biasing current $I_B$ is supplied to the source terminals of the differential transistors of the two comparator legs. Drain terminals of the load transistors of the two comparator legs are connected to reference potential, in particular ground.

In an example, the hysteresis generating circuit comprises two generator legs each with a differential transistor and a load transistor. The differential transistors of the two generator legs are coupled to receive a hysteresis biasing current $I_{B\_hys}$ and are configured for variably dividing the hysteresis biasing current $I_{B\_hys}$ based on differential voltage applied to the control terminals of the differential transistors of the generator legs. The differential voltage corresponds to a hysteresis control voltage $V_{hys-in}$. One of the generator legs comprises an output node, at which a hysteresis current $I_{hys}$ is provided, which is a function of the hysteresis control voltage $V_{hys-in}$.

In an example, the load transistors of the two generator legs are configured to form a current mirror.

In an example, biasing In an example, the hysteresis generating circuit further comprises a current mirror circuit connected to the output node and arranged to draw a current from the hysteresis comparator circuit, which is substantially equal to the hysteresis current $I_{hys}$.

In an example, the current mirror circuit comprises at least two transistors.

In an example, the hysteresis comparator further comprises a supply current circuit arranged to supply the comparator biasing current $I_B$ to the hysteresis comparator circuit and the hysteresis biasing current $I_{B\_hys}$ to the hysteresis generating circuit. The comparator biasing current $I_B$ and the hysteresis biasing current $I_{B\_hys}$ are substantially equal $I_B=I_{B\_hys}$.

In an example, a ratio $\alpha$ of the hysteresis voltage $V_{hys}$ and the hysteresis control voltage $V_{hys-in}$ is a constant defined by the properties of the differential transistors of the hysteresis generating circuit and the properties of the differential transistors of the hysteresis comparator circuit.

Some of the above embodiments, as applicable, may be implemented using a variety of different circuitry components. For example, the exemplary topology in the figures and the discussion thereof is presented merely to provide a useful reference in discussing various aspects of the invention. Of course, the description of the topology has been simplified for purposes of discussion, and it is just one of many different types of appropriate topologies that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

In the claims, any reference signs placed between parentheses shall not be construed as limiting the claim. The word "comprising" does not exclude the presence of other elements or operations then those listed in a claim. Furthermore, the terms "a" or "an", as used herein, are defined as one or as more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to distinguish arbitrarily between the elements such terms describe. Thus, these terms are not necessarily intended to indicate temporal or other prioritization of such elements. The mere fact that certain measures are recited in mutually different claims does not indicate that a combination of these measures cannot be used to advantage.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

LIST OF REFERENCE SIGNS AND VARIABLES

100: hysteresis generating circuit;
101: hysteresis generating circuit;
110: current source;
120: voltage supply;
130: differential transistor;
135: junction node;
140: differential transistor;
145: output node;
150: (first) load transistor;
160: (second) load transistor;
170: transistor;
175: transistor;
180: transistor;
185: transistor;
200: hysteresis comparator circuit;
201: hysteresis comparator circuit;
210: differential transistor;
215: input $V_n$;
220: differential transistor;
225: input $V_p$;
230: (first) load transistor;
240: (second) load transistor;
250: single-pole double-throw switch;
255: hysteresis current node;
256: hysteresis current node;
260: output stage transistor, OS-transistor;
261: junction node;
265: output stage transistor, OS-transistor;
270: output stage transistor, OS-transistor;
275: output stage transistor, OS-transistor;
280: junction node;
285: junction node;
290: (digital) buffer;
295: output node;
300: current source circuitry;
305: common current source;
310: transistor;
320: transistor;
330: transistor;
400: differential pair;
410: (first) comparator leg, C-leg;
415: (second) comparator leg, C-leg;
420: (first) output stage leg, OS-leg;
425: (second) output stage leg, OS-leg;
450: differential pair;
460: (first) generator leg, G-leg;
465: (second) generator leg, G-leg;
$I_B$: comparator biasing current;
$I_{B\text{-}hys}$: hysteresis biasing current;
$I_{hys}$: hysteresis current;
$I_{SD\text{-}G1}, I_{G1}$: source-drain current through the first differential transistor 130;
$I_{SD\text{-}G2}, I_{G2}$: source-drain current through the second differential transistor 140;
$V_{SG\text{-}G2}$: source-gate voltage at the first differential transistor 130;
$V_{SG\text{-}G1}$: source-gate voltage at the second differential transistor 140;
$\beta_{P2}$ transistor constant of the differential transistors 130 and 140;
$V_{PH}$: threshold voltage;
$I_{SD\text{-}D1}$: source-drain current through the first differential transistor 210;
$I_{SD\text{-}D2}$: source-drain current through the second differential transistor 220;
$V_{SG\text{-}D1}$: source-gate voltage at the first differential transistor 210;
$V_{SG\text{-}D2}$: source-gate voltage at the second differential transistor 220;

The invention claimed is:

1. A hysteresis comparator comprising:
   a hysteresis comparator circuit comprising:
      two comparator legs each with a differential transistor and a load transistor;
      wherein the differential transistors of the two comparator legs are connected to receive a comparator biasing current and are configured for variably dividing the comparator biasing current based on the relative levels of respective voltage signals applied to control terminals of the differential transistors of the two comparator legs; and
      an output stage configured for developing an output voltage signal based on respective currents flowing through the load transistors of the two comparator legs, and
   a hysteresis generating circuit configured for providing a hysteresis current, the hysteresis generating circuit selectively coupled to either one of the two comparator legs depending on a level of the output voltage signal, wherein a hysteresis voltage of the hysteresis comparator circuit is a function of the hysteresis current, and wherein the hysteresis generating circuit comprises:
      two generator legs each with a differential transistor and a load transistor;
      wherein the differential transistors of the two generator legs are coupled to receive a hysteresis biasing current and are configured for variably dividing the hysteresis biasing current based on differential voltage applied to the control terminals of the differential transistors of the generator legs, wherein the differential voltage corresponds to a hysteresis control voltage;
      wherein one of the generator legs comprises an output node, at which the hysteresis current is provided, which is a function of the hysteresis control voltage.

2. The hysteresis comparator according to claim 1, wherein the hysteresis generating circuit is further configured to inject the hysteresis current in one of the two comparator legs, which increases a current flowing through the load transistor of the respective comparator leg.

3. The hysteresis comparator according to claim 2, wherein the hysteresis current injected in either one of the two comparator legs establishes a switching point of the output voltage signal when the difference of the respective voltage signals input to the differential transistors corresponds to the hysteresis voltage.

4. The hysteresis comparator according to claim 1, wherein the hysteresis comparator circuit further comprises:
a switch arranged to selectively connect the hysteresis generating circuit with either one of the comparator legs depending on the level of the output voltage signal.

5. The hysteresis comparator circuit according to claim 1, wherein each of the two comparator legs comprises a hysteresis current node connected in series between the differential transistor and the load transistor of the respective one of the two comparator leg.

6. The apparatus according to claim 1, wherein the output stage comprises two output stage legs, each of which is coupled to another one of the two comparator legs.

7. The apparatus according to claim 6, wherein each of the two output stage legs comprises a first transistor and a second transistor,
wherein the first transistors of the two output stage legs are connected to form a current mirror,
wherein the second transistors of the two output stage legs are connected to another one of the load transistors of the two comparator legs, wherein each pair of second transistor and load transistor is configured to form a current mirror.

8. The hysteresis comparator according to claim 7, wherein the hysteresis comparator circuit further comprises:
a buffer, which input is coupled to an output node connected in series between the transistors of one of the output stage legs,
wherein the buffer is configured to output the output voltage signal.

9. The hysteresis comparator according to claim 1, wherein source terminals of the differential transistors of the two comparator legs are connected to each other, wherein the comparator biasing current is supplied to the source terminals of the differential transistors of the two comparator legs,
wherein drain terminals of the load transistors of the two comparator legs are connected to a reference potential.

10. The hysteresis comparator according to claim 1, wherein the load transistors of the two generator legs are configured to form a current mirror.

11. The hysteresis comparator according to claim 1, wherein the hysteresis generating circuit further comprises
a current mirror circuit connected to the output node and arranged to draw
a current from the hysteresis comparator circuit, which is substantially equal to the hysteresis current.

12. The hysteresis comparator according to claim 11, wherein the current mirror circuit comprises at least two transistors.

13. The hysteresis comparator according to claim 1, further comprising:
a supply current circuit arranged to supply the comparator biasing current to the hysteresis comparator circuit and the hysteresis biasing current to the hysteresis generating circuit, wherein the comparator biasing current and the hysteresis biasing current are substantially equal.

14. The hysteresis comparator according to claim 13, wherein a ratio of the hysteresis voltage and the hysteresis control voltage is a constant defined by properties of the differential transistors of the hysteresis generating circuit and properties of the differential transistors of the hysteresis comparator circuit.

15. The hysteresis comparator according to claim 1, wherein the hysteresis generating circuit is further configured to draw the hysteresis current from one of the two comparator legs, which decreases a current flowing through the load transistor of the respective comparator leg.

16. The hysteresis comparator according to claim 6, wherein the hysteresis current drawn from either one of the two comparator legs establishes a switching point of the output voltage signal when the difference of the respective voltage signals input to the differential transistors corresponds to the hysteresis voltage.

* * * * *